(12) United States Patent
Terauchi

(10) Patent No.: US 10,856,415 B2
(45) Date of Patent: Dec. 1, 2020

(54) PRINTED WIRING BOARD AND METHOD FOR MANUFACTURING THE SAME

(71) Applicant: IBIDEN CO., LTD., Ogaki (JP)

(72) Inventor: Ikuya Terauchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/684,639

(22) Filed: Nov. 15, 2019

(65) Prior Publication Data

US 2020/0163214 A1 May 21, 2020

(30) Foreign Application Priority Data

Nov. 15, 2018 (JP) .................. 2018-214696

(51) Int. Cl.
| | |
|---|---|
| H05K 1/11 | (2006.01) |
| H05K 3/34 | (2006.01) |
| H05K 3/40 | (2006.01) |
| H05K 3/28 | (2006.01) |
| H05K 1/18 | (2006.01) |

(52) U.S. Cl.
CPC ............ *H05K 1/113* (2013.01); *H05K 1/185* (2013.01); *H05K 3/28* (2013.01); *H05K 3/34* (2013.01); *H05K 3/4007* (2013.01); *H05K 2201/094* (2013.01); *H05K 2203/072* (2013.01); *H05K 2203/0723* (2013.01)

(58) Field of Classification Search
CPC .......... H05K 1/111; H05K 1/11; H05K 1/112; H05K 1/18; H05K 3/34; H05K 3/341; H05K 3/3415; H05K 3/3421; H05K 3/3426; H05K 3/3431; H05K 3/3436; H05K 3/3442
See application file for complete search history.

(56) References Cited

U.S. PATENT DOCUMENTS

| | | | |
|---|---|---|---|
| 6,605,524 B1 * | 8/2003 | Fan .................. | H01L 24/11 257/E21.508 |
| 2009/0053459 A1 * | 2/2009 | Hirose .............. | H01L 23/49811 428/76 |
| 2018/0114747 A1 * | 4/2018 | Delacruz .......... | H01L 23/49827 |

FOREIGN PATENT DOCUMENTS

JP  2017-073497 A  4/2017

* cited by examiner

*Primary Examiner* — Jeremy C Norris
(74) *Attorney, Agent, or Firm* — Oblon, McClelland, Maier & Neustadt, L.L.P.

(57) ABSTRACT

A printed wiring board includes a conductor layer including first and second pads, a coating layer covering the conductor layer and having first opening exposing the first pad and second opening exposing the second pad, and metal bumps including a first bump on the first pad and a second bump on the second pad such that the first and second bumps protrude from the coating layer. The first and second openings are formed such that diameter of the second pad is smaller than diameter of the first pad. The first and second bumps are formed such that height of protruding portion of the first bump from the surface of the coating layer is substantially equal to height of protruding portion of the second bump from the surface of the coating layer and that the second bump covers an area of the coating layer on the surface surrounding the second opening.

20 Claims, 4 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2018-214696, filed Nov. 15, 2018, the entire contents of which are incorporated herein by reference.

BACKGROUND OF THE INVENTION

Field of the Invention

The present invention relates to a printed wiring board and a method for manufacturing the printed wiring board.

Description of Background Art

Japanese Patent Application Laid-Open Publication No. 2017-73497 describes a printed wiring board that includes: a conductor layer including a conductor pad; a coating insulating layer having an opening exposing the conductor pad; and a bump formed on the conductor pad exposed in the opening. The bump is formed of an electroless plating metal layer, a barrier metal layer, and a solder layer. The entire contents of this publication are incorporated herein by reference.

SUMMARY OF THE INVENTION

According to one aspect of the present invention, a printed wiring board includes an insulating layer, a conductor layer formed on the insulating layer and including a first conductor pad and a second conductor pad, a coating insulating layer formed on the insulating layer such that the coating insulating layer is covering the conductor layer and has a first opening portion exposing the first conductor pad and a second opening portion exposing the second conductor pad, and metal bumps including a first metal bump formed on the first conductor pad and a second metal bump formed on the second conductor pad such that the first and second metal bumps protrude from a surface of the coating insulating layer on the opposite side with respect to the insulating layer. The first and second opening portions of the coating insulating layer are formed such that a diameter of the second conductor pad is smaller than a diameter of the first conductor pad, and the first and second metal bumps are formed such that a height of a protruding portion of the first metal bump relative to the surface of the coating insulating layer is substantially equal to a height of a protruding portion of the second metal bump relative to the surface of the coating insulating layer and that the second metal bump covers an area of the coating insulating layer on the surface surrounding the second opening portion.

According to another aspect of the present invention, a method for manufacturing a printed wiring board includes forming a conductor layer including a first conductor pad and a second conductor pad on an insulating layer, forming a coating insulating layer on the insulating layer such that the coating insulating layer covers the conductor layer, forming a first opening portion and a second opening portion in the coating insulating layer such that the first opening portion penetrates through the coating insulating layer and exposes the first conductor pad from the coating insulating layer and that the second opening portion penetrates through the coating insulating layer and exposes the second conductor pad from the coating insulating layer, and forming metal bumps including a first metal bump filling the first opening portion and formed on the first conductor pad, and a second metal bump filling the second opening portion and formed on the second conductor pad such that a height of a protruding portion of the first metal bump relative to a surface of the coating insulating layer is substantially equal to a height of a protruding portion of the second metal bump relative to the surface of the coating insulating layer and that the second metal bump covers an area of the coating insulating layer on the surface surrounding the second opening portion. The first and second opening portions of the coating insulating layer are formed such that a diameter of the second conductor pad is smaller than a diameter of the first conductor pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
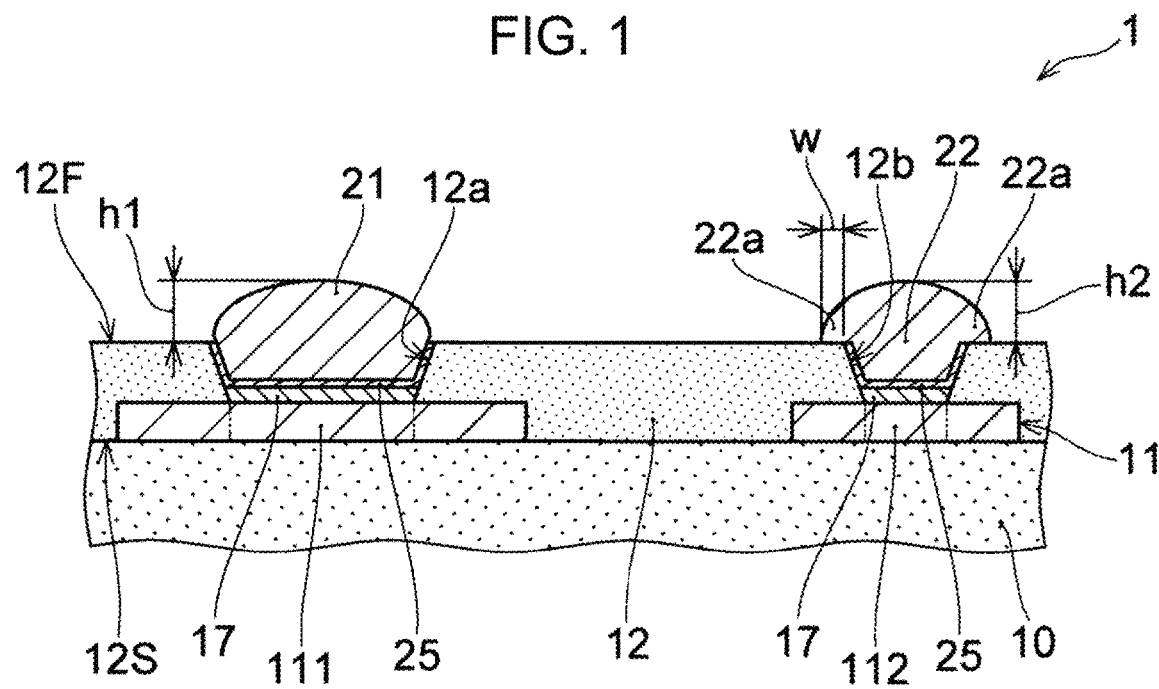
FIG. 1 is an enlarged cross-sectional view of a portion of a printed wiring board according to an embodiment of the present invention.

Embodiments will now be described with reference to the accompanying drawings, wherein like reference numerals designate corresponding or identical elements throughout the various drawings.

A printed wiring board according to an embodiment of the present invention is described with reference to the drawings. FIG. 1 illustrates a partial cross-sectional view of a printed wiring board 1 (hereinafter, the printed wiring board is also simply referred to as a "wiring board") which is an example of the printed wiring board of the embodiment. As illustrated in FIG. 1, the printed wiring board 1 includes a first insulating layer 10, a first conductor layer 11, and a coating insulating layer 12 which is formed on the first insulating layer 10 and the first conductor layer 11. The coating insulating layer 12 has a first surface (12F) and a second surface (12S) on an opposite side with respect to the first surface (12F), and is laminated on the first insulating layer 10 and the first conductor layer 11 with the second surface (12S) facing the first insulating layer 10 and the first conductor layer 11. In the coating insulating layer 12, a first opening part (12a) that exposes a portion of the first conductor layer to form a first conductor pad 111 in the first conductor layer 11 and a second opening part (12b) that exposes a portion of the first conductor layer to form a second conductor pad 112 in the first conductor layer 11 are formed. A first metal bump 21 is formed on the first conductor pad 111. A second metal bump 22 is formed on the second conductor pad 112. The first metal bump 21 and the second metal bump 22 protrude from the first surface (12F) of the coating insulating layer 12.

The first insulating layer 10 is formed of, for example, an organic resin material such as an epoxy resin or a polyimide resin. The organic resin material may be an epoxy resin or the like that does not contain a reinforcing material, and may also be a material obtained by impregnating a reinforcing material such as a glass fiber with epoxy or other resin compositions. A resin composition such as epoxy may contain an inorganic filler such as silica. Further, the first insulating layer 10 may be formed of an inorganic material such as ceramic, silicon, or glass. The first insulating layer 10 may be a single layer as illustrated in FIG. 1, or may be a laminated structure, that is, a build-up layer formed by 2 or more insulating layers and 1 or more conductor layers sandwiched between the insulating layers. When the first insulating layer 10 is a build-up layer, an insulating layer of the build-up layer may include via conductors connecting conductor layers on both sides of the insulating layer.

In the first conductor layer 11, multiple conductor pads of different sizes are formed by opening parts of the coating insulating layer 12. FIG. 1 illustrates the first conductor pad 111 and the second conductor pad 112 which are respectively formed by the first opening part (12a) and the second opening part (12b) of the coating insulating layer 12 in the first conductor layer 11 of the printed wiring board 1. As illustrated in FIG. 1, a diameter of the second conductor pad 112 is smaller than a diameter of the first conductor pad 111. The diameter of the first conductor pad 111 is, for example, 40 μm or more and 80 μm or less. The diameter of the second conductor pad 112 is, for example, 20 μm or more and 40 μm or less. The term "diameter" is used for convenience. However, planar shapes of the conductor pads and the opening parts of the coating insulating layer 12 described in detail below are not limited to circles. For example, the conductor pads may be formed in planar shapes such as elliptical shapes, square shapes, or polygonal shapes other than square shapes. The conductor pads can each have any planar shape. Therefore, the term "diameter" of a conductor pad means a maximum value of a distance between any two points belonging to an outer periphery of the conductor pad, that is, a portion of the corresponding opening part of the coating insulating layer 12 in contact with the first conductor layer 11. The first conductor layer 11 may be formed of any conductive metal, for example, is formed of copper. A thickness of the first conductor layer 11 is, for example, 3 μm or more and 20 μm or less. The coating insulating layer 12 may be, for example, a solder resist layer. An example of a material forming such a solder resist layer is a thermosetting epoxy resin. However, the coating insulating layer 12 may also be formed of an insulating resin film. A thickness of the coating insulating layer 12 is, for example, about 20 μm. As described above, in the coating insulating layer 12, the first opening part (12a) and the second opening part (12b) are formed. The first conductor pad 111 is formed in the first conductor layer 11 by the first opening part (12a). The second conductor pad 112 having a diameter smaller than that of the first conductor pad 111 is formed in that of the first conductor layer 11 by the second opening part (12b). The first opening part (12a) and the second opening part (12b) are formed by irradiating laser beams to the first surface (12F) of the coating insulating layer 12. The diameter of each of the opening parts is larger on a laser beam irradiation side and becomes smaller on an opposite side (deep side) with respect to the laser beam irradiation side. In the example illustrated in FIG. 1, since the laser beams are irradiated from an upper side of the drawing, upper diameters (widths) of the first opening part (12a) and the second opening part (12b) are large and lower diameters (widths) of the first opening part (12a) and the second opening part (12b) are small.

In the example illustrated in FIG. 1, a barrier metal layer 17, an electroless plating layer 25, and an electrolytic plating layer (21e) (see FIG. 7) are formed in this order on the first conductor pad 111 formed in the first conductor layer 11 by the first opening part (12a), and the first metal bump 21 is formed by performing reflow. A barrier metal layer 17, an electroless plating layer 25, and an electrolytic plating layer (22e) (see FIG. 7) are formed in this order on the second conductor pad 112 formed in the first conductor layer 11 by the second opening part (12b), and the second metal bump 22 is formed by performing reflow. The barrier metal layer 17 is formed of a metal different from that of the first conductor layer 11. For example, the material of the barrier metal layer 17 can be a metal containing nickel as a main component. Preferably, the barrier metal layer 17 is a nickel plating layer. By forming the barrier metal layer 17 in this way, the metal (for example, copper) forming the first conductor layer 11 can be prevented from diffusing into the first metal bump 21 or the second metal bump 22 formed thereon. It is thought that good bonding characteristics can be obtained between the first conductor pad 111 and the first metal bump 21 and between the second conductor pad 112 and the second metal bump 22.

As illustrated in FIG. 1, in the first conductor pad 111, the electroless plating layer 25 is formed on an upper surface of the barrier metal layer 17 formed on the first conductor pad 111 and on an inner wall surface of the first opening part (12a) of the coating insulating layer 12. Further, in the second conductor pad 112, the electroless plating layer 25 is formed on an upper surface of the barrier metal layer 17 formed on the second conductor pad 112 and on an inner wall surface of the second opening part (12b) of the coating insulating layer 12. Then, in the first opening part (12a) and in the second opening part (12b), the electrolytic plating layer (21e) and the electrolytic plating layer (22e) are each formed on the electroless plating layer 25 using an electrolytic plating method using the electroless plating layer 25 as a power feeding layer. The electroless plating layer 25 is, for example, an electroless copper plating layer. A thickness of the electroless plating layer 25 is, for example, 0.1 μm or more and 3 μm or less. The electrolytic plating layer (21e) and the electrolytic plating layer (22e) are each formed of multiple or single metal plating film such as Sn/Pb, Sn/Sb, Sn/Ag, Sn/Ag/Cu, Sn/Cu, Sn/Zn, and Sn. Therefore, the first metal bump 21 and the second metal bump 22, which are respectively formed by subjecting the barrier metal layer 17, the electroless plating layer 25 and the electrolytic plating layer (21e) to reflow processing and subjecting the barrier metal layer 17, the electroless plating layer 25 and the electrolytic plating layer (22e) to reflow processing, can each be formed of a metal containing tin as a main component.

The first metal bump 21 and the second metal bump 22 protrude from the first surface (12F), that is, an upper surface of the coating insulating layer 12 in an upward direction which is a lamination direction of the printed wiring board 1. Preferably, heights (h1, h2) of protruding portions of the first metal bump 21 and the second metal bump 22 protruding from the first surface (12F) are substantially equal to each other relative to the first surface (12F) of the coating insulating layer 12. The printed wiring board 1 is electrically connected to an electronic component (not illustrated in the drawings) via the metal bumps (the first metal bump 21 and the second metal bump 22 in the example of FIG. 1) formed on the conductor pads (the first conductor pad 111 and the second conductor pad 112 in the example of FIG. 1). It is thought that high connection reliability can be obtained due to that the protruding portions of the metal bumps protruding from the first surface (12F) have substantially the same height relative to the first surface (12F). The heights (h1, h2) of the protruding portions illustrated in FIG. 1 can be suitably selected, and are, for example, about 20-45 µm. When the heights of the protruding portions of the first and second metal bumps (21, 22) are about this level, even when expansion and/or contraction of the insulating layer is repeated due to heat cycles when the printed wiring board 1 is used, a stress can be absorbed by the metal bumps. It is thought that a stress is not applied only to connecting portions between the first and second metal bumps (21, 22) and the electronic component, and reliability of the printed wiring board 1 is improved.

As illustrated in FIG. 1, the second metal bump 22 covers an area on the first surface (12F) surrounding the second opening part (12b) of the coating insulating layer 12. Therefore, the second metal bump 22 has a flared portion (22a) extending outward of an outer periphery of the second opening part (12b) along the first surface (12F) of the coating insulating layer 12. A length (w) of the flared portion (22a) from a periphery of the second opening part (12b) on the first surface (12F) side to an outer edge of the flared portion (22a) along the first surface (12F) of the coating insulating layer 12 can be suitably selected. However, the length (w) can be, for example, about 5% or more and 30% or less with respect to the diameter of the second opening part (12b) on the first surface (12F) side.

On the other hand, the first metal bump 21 does not include a flared portion on the first surface (12F) of the coating insulating layer 12 like the flared portion (22a) of the second metal bump 22. That is, a length of an outer periphery of the first metal bump 21 on the first surface (12F) is substantially equal to a length of an outer periphery of the first opening part (12a) on the first surface (12F) side.

In the printed wiring board 1, as illustrated in FIG. 1, the first metal bump 21 that does not include a flared portion and the second metal bump 22 that includes the flared portion (22a) are respectively formed with respect to the first conductor pad 111 having a large diameter and the second conductor pad 112 having a small diameter, and thereby, the heights (h1, h2) of the protruding portions of the first metal bump 21 and the second metal bump 22 protruding from the first surface (12F) are equalized. When an electronic component (not illustrated in the drawings) or the like is mounted to the printed wiring board 1, the conductor pads of the printed wiring board 1 are connected to electrodes of the electronic component via the first metal bump 21 and the second metal bump 22. The conductor pads of the printed wiring board 1 can be formed according to sizes and arrangement of the electrodes of the electronic component to be mounted. In the printed wiring board 1, the metal bumps including protruding portions having substantially equal heights relative to the coating insulating layer 12 which is an outermost layer of the printed wiring board 1 are respectively formed on the multiple conductor pads having different sizes. Therefore, when an electronic component is mounted to the printed wiring board 1, it is thought that multiple electrodes of the electronic component can be respectively substantially uniformly brought close to the multiple first and second conductor pads (111, 112). It is thought that a connection failure between the electrodes of the electronic component and the first and second conductor pads (111, 112) is unlikely to occur. Connection reliability between the printed wiring board 1 and an electronic component or the like can be improved.

Next, an example of a method for manufacturing a printed wiring board of the embodiment is specifically described with reference to FIGS. 2-8 using the printed wiring board 1 illustrated in FIG. 1 as an example. In the accompanying drawings, it is not intended to illustrate exact ratios of sizes and shapes of the components of the wiring board.

Figure 2:
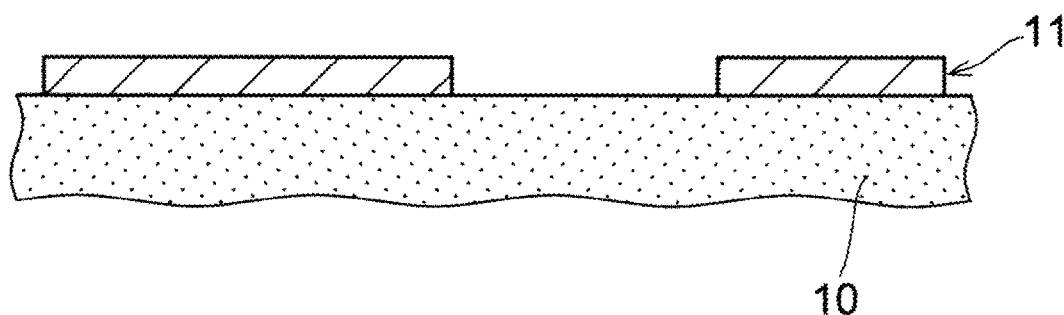
FIG. 2 illustrates a method for manufacturing a printed wiring board according to an embodiment of the present invention.

First, as illustrated in FIG. 2, the first conductor layer 11 including a predetermined conductor pattern is formed on the first insulating layer 10 using an arbitrary method. When the first insulating layer 10 is a build-up layer, the first conductor layer 11 is formed on an outermost insulating layer of the build-up layer, and the first conductor layer 11 forms an outermost conductor layer of the build-up layer. For example, a semi-additive method may be used to form the first conductor layer 11. In this case, after a seed metal film (not illustrated in the drawings) is formed on the entire surface of the first insulating layer 10 by electroless plating or the like, a plating resist (not illustrated in the drawings) having an opening at a predetermined place is formed, and an electrolytic plating film is formed in the opening. The first conductor layer 11 including the electrolytic plating film is formed. After that, the plating resist is removed, and an unnecessary portion of the seed metal film is removed by etching. However, the first conductor layer 11 may also be formed using a full additive method or a subtractive method. The first conductor layer 11 may include wirings such as a signal line and a power source.

Figure 3:
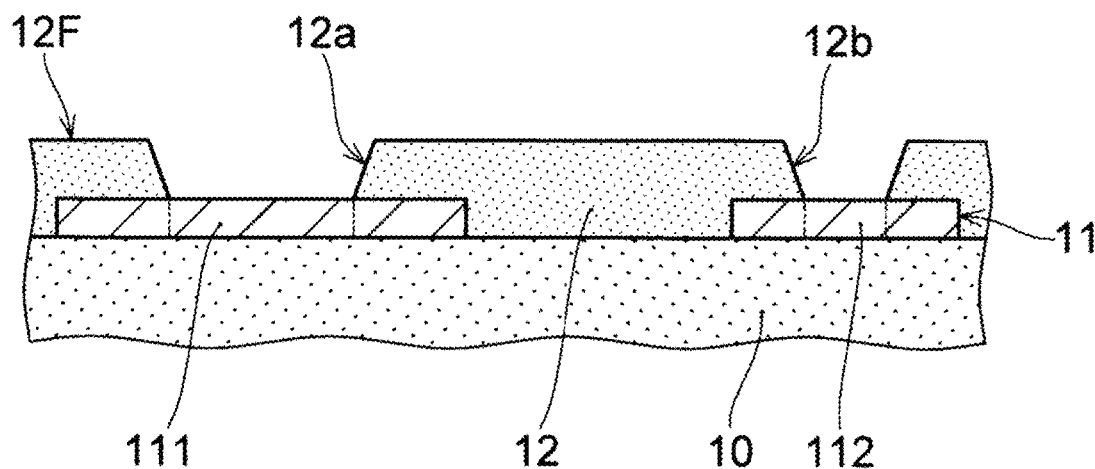
FIG. 3 illustrates the method for manufacturing the printed wiring board according to the embodiment of the present invention.

Next, as illustrated in FIG. 3, the coating insulating layer 12 is formed on the first insulating layer 10 and the first conductor layer 11. The coating insulating layer 12 is formed of, for example, a solder resist. In this case, a solder resist formed of a thermosetting resin film is formed on the first insulating layer 10 and the first conductor layer 11. In this solder resist layer, openings (the first opening part (12a) and the second opening part (12b)) penetrating the solder resist layer and reaching the first conductor layer 11 are formed using, for example, a laser beam irradiation method. The formation of the openings using laser is performed by irradiating CO2 laser beams, UV laser beams, or the like from the first surface (12F) of the coating insulating layer 12. In order to form a small-diameter opening, for example, the second opening part (12b) of the printed wiring board 1 (see FIG. 1), a UV laser beam suitable for small-diameter hole formation may be used. The first opening part (12a) and the second opening part (12b) of inverted truncated cone shapes of each of which an inner wall surface linearly intersects the surface of the first conductor layer 11 are formed. The first conductor pad 111 and the second conductor pad 112 having a diameter smaller than that of the first conductor pad 111 are formed by the first conductor layer 11 exposed by the openings (the first opening part (12a) and the second opening part (12b)) formed in the coating insulating layer 12.

However, the first opening part (12a) and the second opening part (12b) may also be formed in cylindrical shapes of each of which an inner wall surface intersects the surface of the first conductor layer 11 at a right angle. Such first opening part (12a) and second opening part (12b) can be formed, for example, by performing etching such as dry etching, plasma etching, or light etching and then performing an alkali degreasing treatment, instead of by using laser. Further, the first opening part (12a) and the second opening part (12b) may also be formed by using a photosensitive solder resist as a material of the coating insulating layer 12 and by patterning using a photolithography technology.

Figure 4:
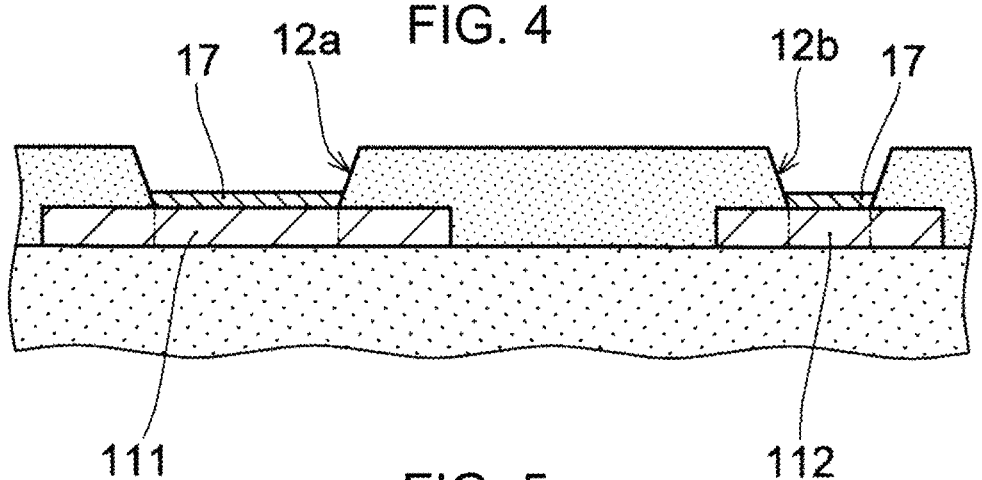
FIG. 4 illustrates the method for manufacturing the printed wiring board according to the embodiment of the present invention.

Next, as illustrated in FIG. 4, the barrier metal layer 17 is formed on the first conductor pad 111 and on the second conductor pad 112. For example, the barrier metal layer 17 can be formed by forming an electroless Ni plating film on the first conductor pad 111 and on the second conductor pad 112. The barrier metal layer 17 may also be formed by forming a plating film of Ni/Pd/Au. Ni/Au or the like instead of an electroless Ni plating film. The barrier metal layer 17 is formed to have a thickness of about 1 μm or more and 3 μm or less. By allowing the barrier metal layer 17 to have a thickness of about 1 μm or more, it is thought that diffusion of a metal forming the first conductor pad 111 or the second conductor pad 112 into the first metal bump 21 or the second metal bump 22 is satisfactorily prevented. On the other hand, even when the barrier metal layer 17 has a thickness of about 3 μm or more, it is thought that the diffusion prevention effect with respect to the metal forming the conductor pads is saturated.

Figure 5:
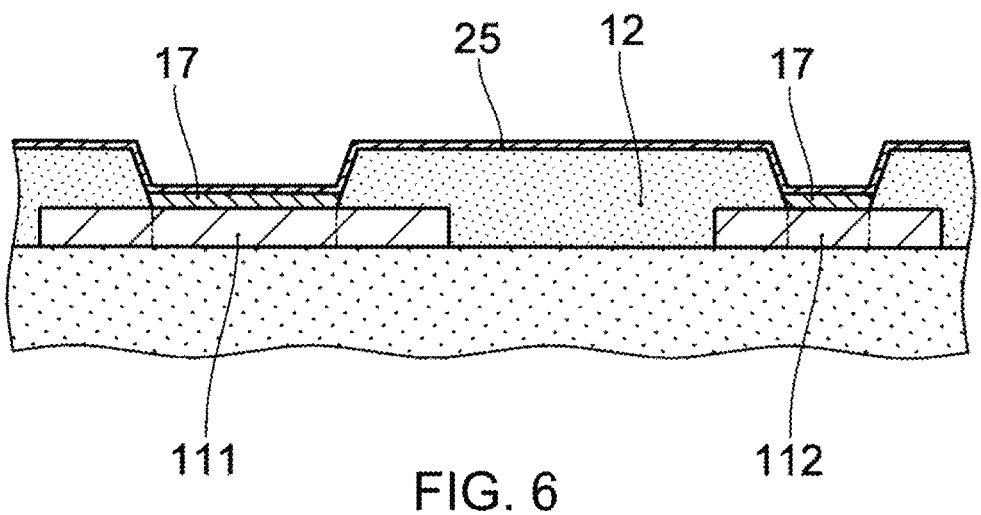
FIG. 5 illustrates the method for manufacturing the printed wiring board according to the embodiment of the present invention.

Next, as illustrated in FIG. 5, the electroless plating layer 25 is formed on the surfaces of the barrier metal layer 17 and the coating insulating layer 12 by, for example, chemical plating (electroless plating). A material of the electroless plating layer 25 is preferably copper, but is not limited to copper. However, instead of the electroless plating layer 25, it is also possible that a metal film formed by sputtering, vacuum deposition, or the like is formed on the surfaces of the barrier metal layer 17 and the coating insulating layer 12. The electroless plating layer 25 becomes a power feeding layer for forming the electrolytic plating layer (21e) and the electrolytic plating layer (22e) illustrated in FIG. 7 (to be described later) by electrolytic plating. Therefore, the electroless plating layer 25 may be a conductive metal film. A thickness of the electroless plating layer 25 is about 0.05 μm or more and 1.0 μm or less.

Figure 6:
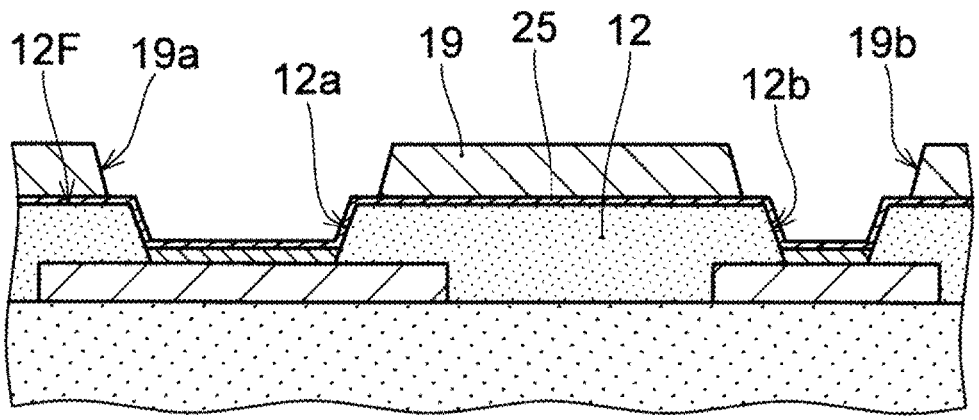
FIG. 6 illustrates the method for manufacturing the printed wiring board according to the embodiment of the present invention.

Next, as illustrated in FIG. 6, for example, a UV-curable thick plating resist (dry film resist) layer 19 is laminated on the electroless plating layer 25 on the first surface (12F) (see FIG. 1) which is the upper surface of the coating insulating layer 12. In the plating resist layer 19, an opening (19a) and an opening (19b) are respectively formed at portions corresponding to the first opening part (12a) and the second opening part (12b) of the coating insulating layer 12. The opening (19a) and the opening (19b) are formed, for example, by exposure and development of the plating resist layer 19. A diameter of the opening (19a) of the plating resist layer 19 on the coating insulating layer 12 side is larger than the diameter of the first opening part (12a) of the coating insulating layer 12 on the first surface (12F) side. A diameter of the opening (19b) of the plating resist layer 19 on the coating insulating layer 12 side is larger than the diameter of the second opening part (12b) of the coating insulating layer 12 on the first surface (12F) side.

Figure 7:
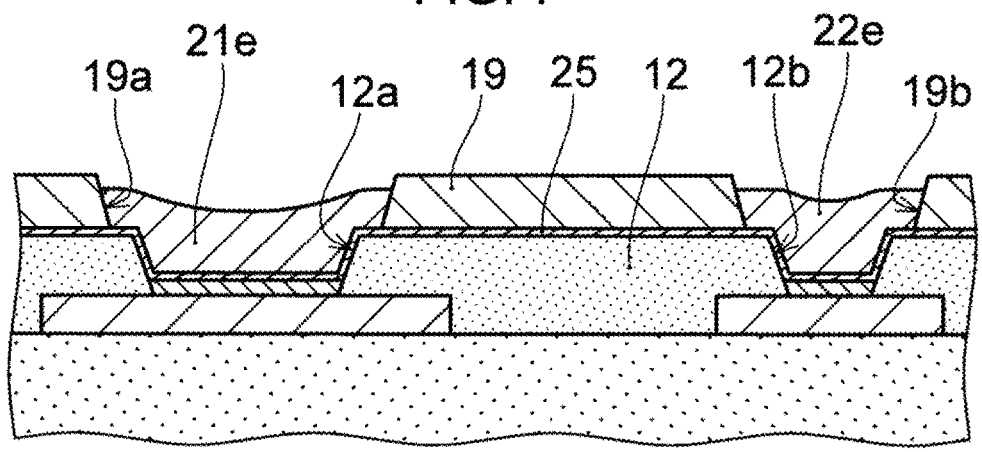
FIG. 7 illustrates the method for manufacturing the printed wiring board according to the embodiment of the present invention.

Next, as illustrated in FIG. 7, the electrolytic plating layer (21e) is formed in the first opening part (12a) of the coating insulating layer 12 and in the opening (19a) of the plating resist layer 19 using an electrolytic plating method using the electroless plating layer 25 as a power feeding layer. Further, the electrolytic plating layer (22e) is formed in the second opening part (12b) of the coating insulating layer 12 and in the opening (19b) of the plating resist layer 19 using an electrolytic plating method using the electroless plating layer 25 as a power feeding layer. As illustrated in FIG. 7, the diameter of the opening (19a) is larger than the diameter of the opening (19b). Therefore, a center portion of the surface of the electrolytic plating layer (21e) is more recessed than a center portion of the surface of the electrolytic plating layer (22e). That is, a larger recess is formed on the upper surface of the electrolytic plating layer (21e) as compared to the electrolytic plating layer (22e).

Figure 8:
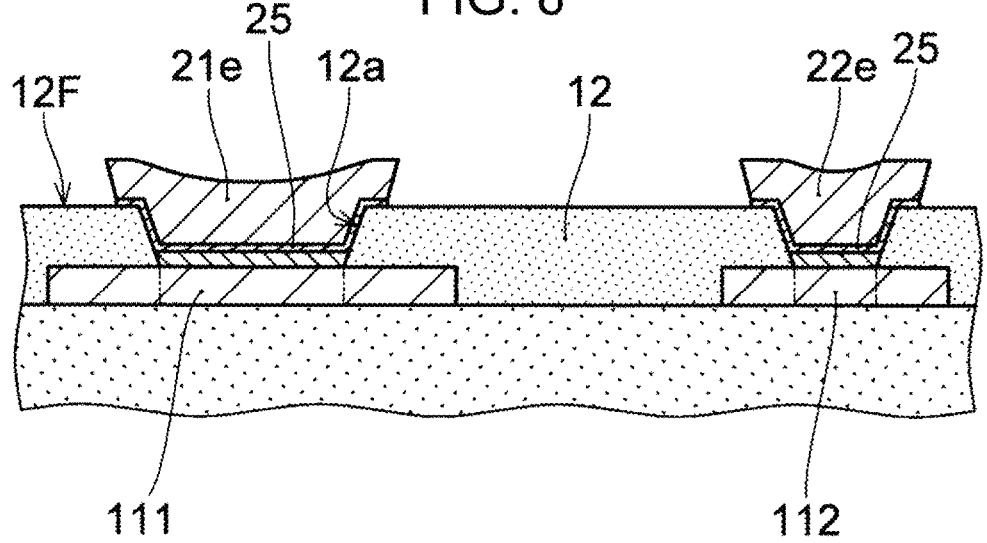
FIG. 8 illustrates the method for manufacturing the printed wiring board according to the embodiment of the present invention.

Subsequently, as illustrated in FIG. 8, the plating resist layer 19 (see FIG. 7) is removed. Next, the electroless plating layer 25 exposed by the removal of the plating resist layer 19 is removed by etching. Due to the removal, the first surface (12F) of the coating insulating layer 12 is exposed. A portion of the electrolytic plating layer (21e) and a portion of the electrolytic plating layer (22e) protrude from the first surface (12F) of the coating insulating layer 12.

After that, the barrier metal layer 17, the electroless plating layer 25 and the electrolytic plating layer (21e) on the first conductor pad 111 and the barrier metal layer 17, the electroless plating layer 25 and the electrolytic plating layer (22e) on the second conductor pad 112 are subjected to reflow processing. The recess of the center portion of the surface of the electrolytic plating layer (21e) is large. Therefore, when a metal material melted by reflow is rounded by a tension moment due to a surface tension, of a part of the electrolytic plating layer (21e) protruding from the first surface (12F) of the coating insulating layer 12, a portion formed on an outer side of the outer periphery of the first opening part (12a) of the coating insulating layer 12 on the first surface (12F) side is strongly attracted toward near the center of the electrolytic plating layer (21e).

Therefore, the first metal bump 21 formed through reflow does not include a flared portion on the first surface (12F) of the coating insulating layer 12. Further, the electroless plating layer 25 sandwiched between the first surface (12F) of the coating insulating layer 12 and the electrolytic plating layer (21e) diffuses into the electrolytic plating layer (21e) during the reflow processing. Therefore, after the reflow processing, as illustrated in FIG. 1, the electroless plating layer 25 does not cover the coating insulating layer 12 on an outer edge of the first opening part (12a) on the first surface (12F) side. On the other hand, the recess of the center portion of the surface of the electrolytic plating layer (22e) is small. Therefore, although a melted metal material is rounded by a surface tension that occurs due to melting of the metal material by reflow, of a part of the electrolytic plating layer (22e) protruding from the first surface (12F) of the coating insulating layer 12, an entire portion formed on an outer side of the outer periphery of the second opening part (12b) of the coating insulating layer 12 on the first surface (12F) side is not attracted toward a center portion. Therefore, as illustrated in FIG. 1, the second metal bump 22 formed through reflow has the flared portion (22a) extending outward of the outer periphery of the second opening part (12b) along the first surface (12F) of the coating insulating layer 12.

According to the manufacturing method of the present embodiment, even when the printed wiring board 1 includes multiple conductor pads having different sizes, metal bumps with protruding portions having substantially equal heights can be respectively simultaneously formed on the conductor pads. The printed wiring board 1 having high connection reliability can be easily manufactured.

Figure 9:
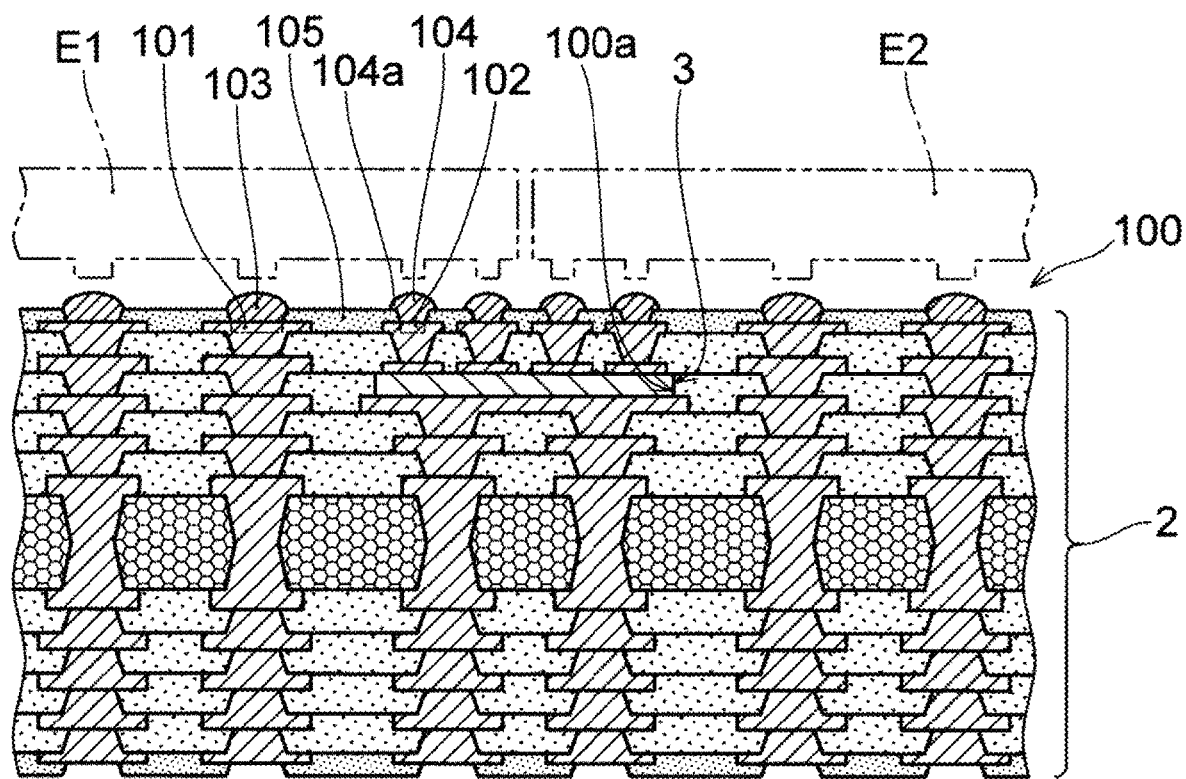
FIG. 9 is a cross-sectional view illustrating an application example of a printed wiring board according to an embodiment of the present invention.

FIG. 9 is a cross-sectional view illustrating an application example of the printed wiring board 1 manufactured using the manufacturing method of the embodiment. In this application example, a wiring board 100 is formed by embedding a semiconductor substrate 3, which has a rewiring layer, in a recess (100*a*) formed penetrating an insulating layer formed on an inner side of an outermost layer of a multilayer wiring board 2. The semiconductor substrate 3 has multiple conductor pads having sizes and pitches corresponding to sizes and pitches of miniaturized terminals formed on two electronic components (E1, E2) mounted on the wiring board 100, and the conductor pads are connected to second conductor pads 102 (the second conductor pad 112 in the example of FIG. 1) of the multilayer wiring board 2 by via conductors penetrating the outermost insulating layer. The multilayer wiring board 2 has conductor pads 101 (the first conductor pad 111 in the example of FIG. 1) formed with sizes and pitches larger than those of the conductor pads 102. Metal bumps 103 (the first metal bump 21 in the example of FIG. 1) are respectively formed on the large-diameter conductor pads 101 of the multilayer wiring board 2 using the manufacturing method of the embodiment. Metal bumps 104 (the second metal bump 22 in the example of FIG. 1) each including a flared portion (104*a*) (the flared portion (22*a*) in the example of FIG. 1) on the coating insulating layer 105 are respectively formed on the small-diameter conductor pads 102. The wiring board 100 has two types of conductor pads (101, 102) of different shapes connected to the same electronic component (the electronic component (E1) or the electronic component (E2)). Miniaturized terminals of the electronic components (E1, E2) are connected to each other via the metal bumps 104 on the small-diameter conductor pads 102. As a result, high-density wirings are formed and a broadband signal transmission path is formed on (inside) the substrate.

Conditions, processing order and the like of the manufacturing method described above can be modified as appropriate. Depending on a structure of a printed wiring board to be manufactured, some of the processes may be omitted, and other processes may be added. Further, a manufacturing method according to an embodiment of the present invention may be applied to various wiring boards that include multiple conductor pads of different sizes.

In Japanese Patent Application Laid-Open Publication No. 2017-73497, in order to prevent occurrence of an alloy residue around the bump, the barrier metal layer is formed between the electroless plating metal layer and the solder layer.

In the printed wiring board of Japanese Patent Application Laid-Open Publication No. 2017-73497, the electroless plating metal layer and the barrier metal layer have a flared portion flaring radially outward from the opening of the coating insulating layer along an upper surface of the coating insulating layer. The solder layer is also formed on the flared portion. When a printed wiring board includes conductor pads of different sizes, it may be difficult to form bumps having the same shape on all the conductor pads. There may be a risk that connection reliability of the printed wiring board may decrease.

A printed wiring board according to an embodiment of the present invention includes: a first insulating layer; a first conductor layer formed on the first insulating layer; and a coating insulating layer that is formed on the first insulating layer and the first conductor layer, and includes a first opening part that exposes a portion of the first conductor layer to form a first conductor pad in the first conductor layer, and a second opening part that exposes a portion of the first conductor layer to form a second conductor pad in the first conductor layer. A diameter of the second conductor pad is smaller than a diameter of the first conductor pad. A first metal bump and a second metal bump are respectively formed on the first conductor pad and the second conductor pad. The first metal bump and the second metal bump protrude from a first surface of the coating insulating layer, the first surface being on an opposite side with respect to the first insulating layer. A height of a protruding portion of the first metal bump relative to the first surface and a height of a protruding portion of the second metal bump relative to the first surface are substantially equal to each other. The second metal bump covers the coating insulating layer in an area on the first surface surrounding the second opening part.

A method for manufacturing a printed wiring board according to an embodiment of the present invention includes: forming a conductor layer on a first insulating layer; forming a coating insulating layer on the first insulating layer and the conductor layer; forming opening parts in the coating insulating layer penetrating the coating insulating layer from a surface side of the coating insulating layer to expose from the coating insulating layer a first conductor pad and a second conductor pad having a diameter smaller than a diameter of the first conductor pad; and forming, respectively on the first and second conductor pads, metal bumps that fill the opening parts and form protruding portions protruding from the surface of the coating insulating layer at the same height in a lamination direction. The forming of the metal bumps includes covering the surface of the coating insulating layer with the protruding portion in an area surrounding the opening part at the second conductor pad.

According to an embodiment of the present invention, a printed wiring board having improved connection reliability can be provided in which multiple conductor pads of different sizes are included and connection metal bumps having the same predetermined height are respectively formed on the conductor pads of different sizes.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
    an insulating layer;
    a conductor layer formed on the insulating layer and including a first conductor pad and a second conductor pad;
    a coating insulating layer formed on the insulating layer such that the coating insulating layer is covering the conductor layer and has a first opening portion exposing the first conductor pad and a second opening portion exposing the second conductor pad; and
    a plurality of metal bumps comprising a first metal bump formed on the first conductor pad and a second metal bump formed on the second conductor pad such that the first and second metal bumps protrude from a surface of the coating insulating layer on an opposite side with respect to the insulating layer, wherein the first and second opening portions of the coating insulating layer are formed such that a diameter of the second conductor pad is smaller than a diameter of the first conductor pad, and the first and second metal bumps are formed such that a height of a protruding portion of the first metal bump relative to the surface of the coating insulating layer is substantially equal to a height of a protruding portion of the second metal bump relative to the surface of the coating insulating layer and that the second metal bump has a flared portion entirely covering an area of the coating insulating layer on the surface completely surrounding an outer periphery of the second opening portion.

2. The printed wiring board according to Claim 1, wherein an outer periphery of the first metal bump at the surface of the coating insulating layer is substantially equal to an outer periphery of the first opening portion at the surface of the coating insulating layer.

3. The printed wiring board according to claim 2, further comprising:
a barrier metal layer formed between the first conductor pad and the first metal bump and between the second conductor pad and the second metal bump such that the barrier metal layer comprises a metal material which is different from a metal material forming the conductor layer including the first conductor pad and the second conductor pad.

4. The printed wiring board according to claim 3, wherein the metal material of the first conductor pad and the second conductor pad is copper, and the metal material of the barrier metal layer contains nickel as a main component.

5. The printed wiring board according to claim 4, wherein the first and second opening portions of the coating insulating layer are formed such that the diameter of the first conductor pad is in a range of 40 μm to 80 μm and that the diameter of the second conductor pad is in a range of 20 μm to 40 μm.

6. The printed wiring board according to claim 3, wherein the first and second opening portions of the coating insulating layer are formed such that the diameter of the first conductor pad is in a range of 40 μm to 80 μm and that the diameter of the second conductor pad is in a range of 20 μm to 40 μm.

7. The printed wiring board according to claim 2, wherein the first and second opening portions of the coating insulating layer are formed such that the diameter of the first conductor pad is in a range of 40 μm to 80 μm and that the diameter of the second conductor pad is in a range of 20 μm to 40 μm.

8. The printed wiring board according to claim 2, wherein the first metal bump comprises an electrolytic plating material, and the second metal bump comprises an electrolytic plating material.

9. The printed wiring board according to claim 1, further comprising:
a barrier metal layer formed between the first conductor pad and the first metal bump and between the second conductor pad and the second metal bump such that the barrier metal layer comprises a metal material which is different from a metal material forming the conductor layer including the first conductor pad and the second conductor pad.

10. The printed wiring board according to claim 9, wherein the metal material of the first conductor pad and the second conductor pad is copper, and the metal material of the barrier metal layer contains nickel as a main component.

11. The printed wiring board according to claim 10, wherein the first and second opening portions of the coating insulating layer are formed such that the diameter of the first conductor pad is in a range of 40 μm to 80 μm and that the diameter of the second conductor pad is in a range of 20 μm to 40 μm.

12. The printed wiring board according to claim 9, wherein the first and second opening portions of the coating insulating layer are formed such that the diameter of the first conductor pad is in a range of 40 μm to 80 μm and that the diameter of the second conductor pad is in a range of 20 μm to 40 μm.

13. The printed wiring board according to claim 9, wherein the first metal bump comprises an electrolytic plating material, and the second metal bump comprises an electrolytic plating material.

14. The printed wiring board according to claim 1, wherein the first and second opening portions of the coating insulating layer are formed such that the diameter of the first conductor pad is in a range of 40 μm to 80 μm and that the diameter of the second conductor pad is in a range of 20 μm to 40 μm.

15. The printed wiring board according to claim 1, wherein the first metal bump comprises an electrolytic plating material, and the second metal bump comprises an electrolytic plating material.

16. A method for manufacturing a printed wiring board, comprising:
forming a conductor layer including a first conductor pad and a second conductor pad on an insulating layer;
forming a coating insulating layer on the insulating layer such that the coating insulating layer covers the conductor layer;
forming a first opening portion and a second opening portion in the coating insulating layer such that the first opening portion penetrates through the coating insulating layer and exposes the first conductor pad from the coating insulating layer and that the second opening portion penetrates through the coating insulating layer and exposes the second conductor pad from the coating insulating layer; and
forming a plurality of metal bumps including a first metal bump filling the first opening portion and formed on the first conductor pad, and a second metal bump filling the second opening portion and formed on the second conductor pad such that a height of a protruding portion of the first metal bump relative to a surface of the coating insulating layer is substantially equal to a height of a protruding portion of the second metal bump relative to the surface of the coating insulating layer and that the second metal bump has a flared portion entirely covering an area of the coating insulating layer on the surface completely surrounding an outer periphery of the second opening portion,
wherein the first and second opening portions of the coating insulating layer are formed such that a diameter of the second conductor pad is smaller than a diameter of the first conductor pad.

17. The method for manufacturing a printed wiring board according to claim 16, wherein the forming of the metal bumps includes foaming the protruding portion of the first metal bump such that an outer periphery of the protruding portion of the first metal bump at the surface of the coating insulating layer is substantially equal to an outer periphery of the first opening portion at the surface of the coating insulating layer.

18. The method for manufacturing a printed wiring board according to claim 16, further comprising:
    forming a barrier metal layer comprising a metal material that is different from a metal material of the conductor layer including the first conductor pad and the second conductor pad such that the barrier metal layer is formed between the first conductor pad and the first metal bump and between the second conductor pad and the second metal bump.

19. The method for manufacturing a printed wiring board according to claim 18, wherein the forming of the metal bumps further includes forming an electroless plating film on the coating insulating layer such that the electroless plating film is formed on the barrier metal layer and inner walls of the first and second opening portions, forming on the electroless plating film an electrolytic plating film using the electroless plating film as a power feeding layer, and subjecting the electroless plating film and the electrolytic plating film to reflow processing.

20. The method for manufacturing a printed wiring board according to claim 19, wherein a metal material of the electrolytic plating film contains tin as a main component.

* * * * *